(12) United States Patent
Hou et al.

(10) Patent No.: US 10,353,239 B2
(45) Date of Patent: Jul. 16, 2019

(54) METHOD OF MANUFACTURING NANOWIRE GRID POLARIZER

(71) Applicant: Shenzhen China Star Optoelectronics Technology Co., Ltd., Shenzhen, Guangdong (CN)

(72) Inventors: Jun Hou, Guangdong (CN); Lixuan Chen, Guangdong (CN); Hsiao Hsien Chen, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/569,687

(22) PCT Filed: Jul. 28, 2017

(86) PCT No.: PCT/CN2017/095044
§ 371 (c)(1),
(2) Date: Oct. 26, 2017

(87) PCT Pub. No.: WO2019/006800
PCT Pub. Date: Jan. 10, 2019

(65) Prior Publication Data
US 2019/0011769 A1    Jan. 10, 2019

(30) Foreign Application Priority Data
Jul. 7, 2017 (CN) .......................... 2017 1 0553127

(51) Int. Cl.
*G02F 1/1335* (2006.01)
*G02B 5/30* (2006.01)
(Continued)

(52) U.S. Cl.
CPC .......... *G02F 1/133528* (2013.01); *C23F 4/00* (2013.01); *G02B 5/3058* (2013.01);
(Continued)

(58) Field of Classification Search
CPC ......... G02F 1/133528; G02F 1/133538; G02F 1/133548; G02F 2001/133548; C23F 4/00;
(Continued)

(56) References Cited

U.S. PATENT DOCUMENTS 10,082,612 B2 * 9/2018 Yeo ...................... G02B 5/3058
2002/0122235 A1 9/2002 Kurtz et al.
(Continued)

FOREIGN PATENT DOCUMENTS

CN          1576907 A      2/2005
CN       101073024 A     11/2007
(Continued)

*Primary Examiner* — Lan Vinh
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure discloses a method of manufacturing a nanowire grid polarizer, including: sequentially laminating a first wire grid material layer, a second wire grid material layer and a third wire grid material layer on a substrate; disposing a nano photoresist array on the third wire grid material layer; etching the third wire grid material layer which is not covered by the nano photoresist array by dry-etching; etching the second wire grid material layer which is not covered by the nano photoresist array by wet-etching; etching the first wire grid material layer which is not covered by the nano photoresist array by dry-etching; and removing the nano photoresist array to obtain the nanowire grid polarizer. According to the present disclosure, by disposing multilayer wire grid material film layers having a "sandwich" structure on the substrate, and then by segmentally using the dry-etching method and the wet-etching method in conjunction with different characteristics of materials for the different film layers, the etched thickness for each etching process is reduced, and the defects of a single (Continued)

dry-etching method and a single wet-etching method are avoided. Moreover the manufacture procedure thereof is simple.

13 Claims, 11 Drawing Sheets

(51) Int. Cl.
  *G03F 7/00* (2006.01)
  *C23F 4/00* (2006.01)
  *H01L 21/311* (2006.01)
(52) U.S. Cl.
  CPC ............... *G03F 7/0002* (2013.01); *G02F 2001/133548* (2013.01); *H01L 21/31144* (2013.01)
(58) Field of Classification Search
  CPC ......... H01L 21/31138; H01L 21/31144; G02B 5/3058; G03F 7/0002
  USPC ....... 438/706, 710, 712, 714, 717, 719, 736; 216/13, 41, 47, 75, 77, 24
  See application file for complete search history.

(56) References Cited

U.S. PATENT DOCUMENTS

| 2004/0125449 | A1  | 7/2004  | Sales    |             |
|--------------|-----|---------|----------|-------------|
| 2008/0248205 | A1* | 10/2008 | Blanchet | B41M 3/006  |
|              |     |         |          | 427/282     |
| 2013/0032971 | A1* | 2/2013  | Omatsu   | B82Y 10/00  |
|              |     |         |          | 264/293     |
| 2016/0266295 | A1* | 9/2016  | Cho      | G02B 5/3058 |
| 2017/0090285 | A1* | 3/2017  | Kang     | C23F 1/00   |

FOREIGN PATENT DOCUMENTS

| CN | 101458356    | A | 6/2009  |
| CN | 201387494    | Y | 1/2010  |
| CN | 101688938    | A | 3/2010  |
| CN | 103197368    | A | 7/2013  |
| CN | 106662687    | A | 5/2017  |
| JP | 2012103468   | A | 5/2012  |

\* cited by examiner

METHOD OF MANUFACTURING NANOWIRE GRID POLARIZER

CROSS-REFERENCES TO RELATED APPLICATIONS

This application is a U.S. national phase application, pursuant to 35 U.S.C. § 371, of PCT/CN2017/095044, filed Jul. 28, 2017, designating the United States, which claims priority to Chinese Application No. 201710553127.X, filed Jul. 7, 2017. The entire contents of the aforementioned patent applications are incorporated herein by this reference.

TECHNICAL FIELD

The present disclosure belongs to a LCD manufacturing technical field, and particularly, relates to a method of manufacturing a nanowire grid polarizer.

BACKGROUND ART

A LCD (Liquid Crystal Display), as a platform and a carrier for information exchange, carries transmission of a large amount of information, performs a more and more important function under a social background of development and progress of the technology, and gradually becomes a key point of attention to people; and people have more and more expectations for new display modes and display effects. A polarizing plate, as an important component of the LCD, may absorb the light in a direction perpendicular to a polarizing axis, and only makes the light parallel with a polarizing axis direction pass through, thereby converting natural light into straight polarized light. However, more than 50% of light will be lost in this way, which greatly reduces the overall transmittance of the LCD. In addition, in the existing manufacturing process of the polarizer in mass production, a plurality of protection films and compensation films are needed, it will not only make the overall LCD be thick, but also raise the cost, and the difficulty of a manufacture procedure will also be increased, which all greatly limit the application of the LCD on energy conservation and portability.

Nanowire grids can transmit incident light of which a direction of the electric field is perpendicular to the wire grid direction, while reflect the light of which the direction of the electric field is parallel to the wire grid direction. Based on the working principle, the reflected light may be reused through the manners of adding anti-reflection films and the like, and thus, the ability to transmit the incident light of the nanowire grid polarizer is much greater than that of the conventional polarizer, the transmittance thereof may be up to more than 90%, and the contrast is also as high as 10000:1, which may greatly improve the transmittance and contrast of the LCD to meet the requirements of high transmittance and high contrast in the market.

The polarizing characteristics of the nanowire grids is decided by the material and the structure of the wire grid, and the structure parameters of the wire grid mainly include wire grid linewidth, wire grid depth, wire grid aspect ratio and so on. When the wire grid aspect ratio is small enough, and is far less than the wavelength range of the incident light, the wire grid can reflect almost all of the light of which the electric field vector component vibrates parallel to the wire grid, so that almost all of the light of which the electric field vector component is perpendicular to the wire grid is transmitted, and the smaller the wire grid aspect ratio is, the better the polarizing effect is. Therefore, how to obtain a sufficiently small wire grid aspect ratio and an appropriate depth-to-width ratio becomes the key to manufacturing the nanowire grids. The current main-stream manufacturing method mainly includes a dry-etching method and a wet-etching method; the principle of the dry-etching method is bombarding a wire grid material using high energy plasma, so that molecules of the material without PR protection escape, to produce an etching effect. The etching of this method is accurate and nanowire grids with a relatively large depth-to-width ratio can be obtained, but the energy consumption is too large and the equipment is expensive; and the wet-etching method uses chemical reagents to react with the wire grid material, reactants are dissolved in the chemical reagents, the part without PR protection are performed a reaction with the wire grid material in priority, and this method may greatly reduce energy consumption compared to the dry-etching method, but the etching positions thereof is isotropic and imprecise. Moreover, the reaction process is difficult to be controlled.

SUMMARY

In order to solve the above problems existing in the prior art, the present disclosure adopts the following technical solutions:

a method of manufacturing a nanowire grid polarizer, including:

Step S1 of sequentially laminating a first wire grid material layer, a second wire grid material layer and a third wire grid material layer on a substrate;

Step S2 of disposing a nano photoresist array on the third wire grid material layer by nanoimprinting;

Step S3 of etching the third wire grid material layer which is not covered by the nano photoresist array by dry-etching;

Step S4 of etching the second wire grid material layer which is not covered by the nano photoresist array by wet-etching;

Step S5 of etching the first wire grid material layer which is not covered by the nano photoresist array by dry-etching; and Step S6 of removing the nano photoresist array to obtain the nanowire grid polarizer.

Furthermore, the first wire grid material layer has a thickness of 10 nm-300 nm; the second wire grid material layer has a thickness of 10 nm-150 nm; and the third wire grid material layer has a thickness of 10 nm-300 nm.

Furthermore, the thicknesses of the first wire grid material layer, the second wire grid material layer and the third wire grid material layer are equal to each other.

Furthermore, materials for the first wire grid material layer and the third wire grid material layer are metals; and a material for the second wire grid material layer is selected from any one of $SiO_2$, SiN and ITO.

Furthermore, the materials for the first wire grid material layer and the third wire grid material layer are the same.

Furthermore, the first wire grid material layer and the third wire grid material layer are disposed by using physical vapor deposition, and the second wire grid material layer is disposed by using physical vapor deposition or chemical vapor deposition.

Furthermore, nanowire grids of the the nanowire grid polarizer have a wirewidth of 10 nm-100 nm, and an aspect ratio of 20 nm-200 nm.

Furthermore, the step S2 includes: disposing a photoresist layer on the third wire grid material layer; performing thermal curing on the photoresist layer by using an ultraviolet light after imprinting the photoresist layer by using a nanoimprint mold, to form the nano photoresist array and a photoresist residual layer located between the nano photoresist array, on the third wire grid material layer; and removing the photoresist residual layer.

Furthermore, the photoresist layer has a thickness of 1 μm-5 μm.

Furthermore, the thermal curing is performed by using the ultraviolet lighthaving a wavelength of 300 nm-400 nm and an energy of 300 MJ-5000 MJ at a temperature of 80° C.-300° C. for 10 s-300 s.

In the present disclosure, the nanowire grid polarizer having a complete structure and an appropriate depth-to-width ratio may be obtained by disposing multilayer wire grid material film layers having a "sandwich" structure on the substrate, and then by segmentally using the dry-etching method and the wet-etching method in conjunction with different characteristics of materials for the different film layers to reduce the etched thickness for each etching process, and by adjusting the etching conditions. Moreover the manufacture procedure of the manufacturing method is simple. According to the method of manufacturing a nanowire grid polarizer of the present disclosure, compared with a method of using a single wet-etching method or a single dry-etching method to dispose the nanowire grids in the prior art, on one hand, the problems existing in the dry-etching method, that the energy consumption is too large and that the film material compositions are limited, may be avoided, and on the other hand, the problems existing in the wet-etching method, that larger tapper angles caused by the isotropy may be generated on the film layer, that the depth-to-width ratio is difficult to be controlled, that the etching speed is difficult to be controlled and the like, may be also avoided.

BRIEF DESCRIPTION OF THE DRAWINGS

The above and other aspects, characteristics and advantages of embodiments of the present disclosure will become more apparent, by the following descriptions taken in conjunction with the accompanying drawings, in which.

DETAILED DESCRIPTION OF EXEMPLARY EMBODIMENTS

Figure 1:
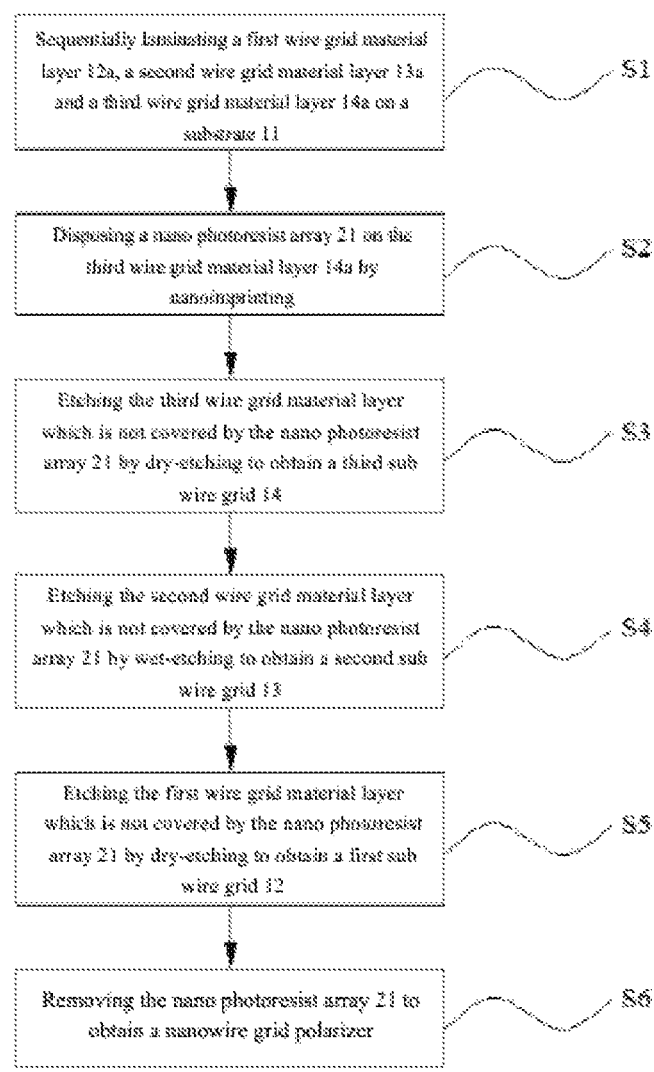
FIG. 1 is a step flowchart of a method of manufacturing a nanowire grid polarizer in accordance with an embodiment of the present disclosure.

Embodiments of the present disclosure will be described in detail below by referring to the accompany drawings. However, the present disclosure can be implemented in many different forms, and the present disclosure should not be constructed to be limited to the specific embodiment set forth herein. Instead, these embodiments are provided for explaining the principle and actual application of the present disclosure, so that those skilled in the art would understand various embodiments of the present disclosure and modifications which are suitable for specific intended applications. In the drawings, in order to describe clearly, the shapes and sizes of the components may be exaggerated, and the same reference signs will always be used to indicate the same or similar components.

It will be understood that although various elements may be described herein by using terms such as "first", "second" and the like, the elements should not be limited by these terms. These terms are only used to distinguish one element from another.

The present disclosure provides a method of manufacturing a nanowire grid polarizer, referring to FIG. 1 for details, which includes:

Step S1: sequentially laminating a first wire grid material layer 12a, a second wire grid material layer 13a and a third wire grid material layer 14a on a substrate 11.

Figure 2:
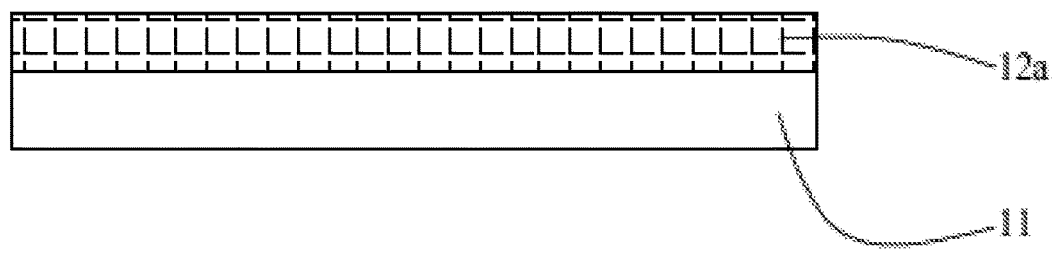
FIGS. 2-11 are process flowcharts of a method of manufacturing a nanowire grid polarizer in accordance with an embodiment of the present disclosure.
Figure 3:
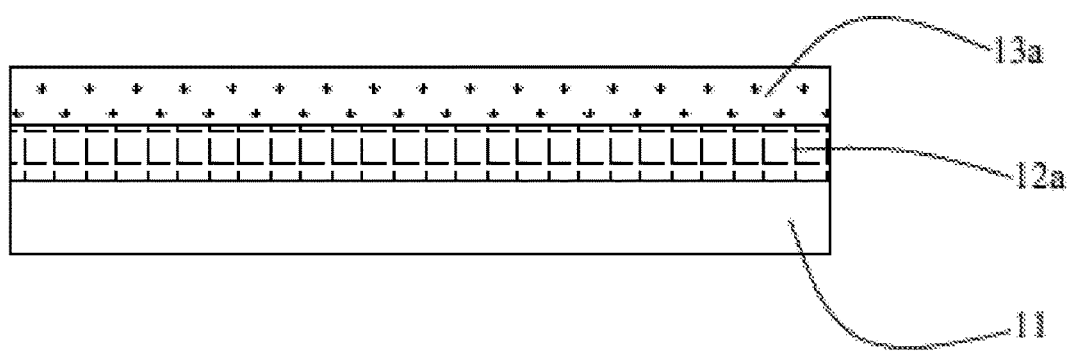
Figure 4:
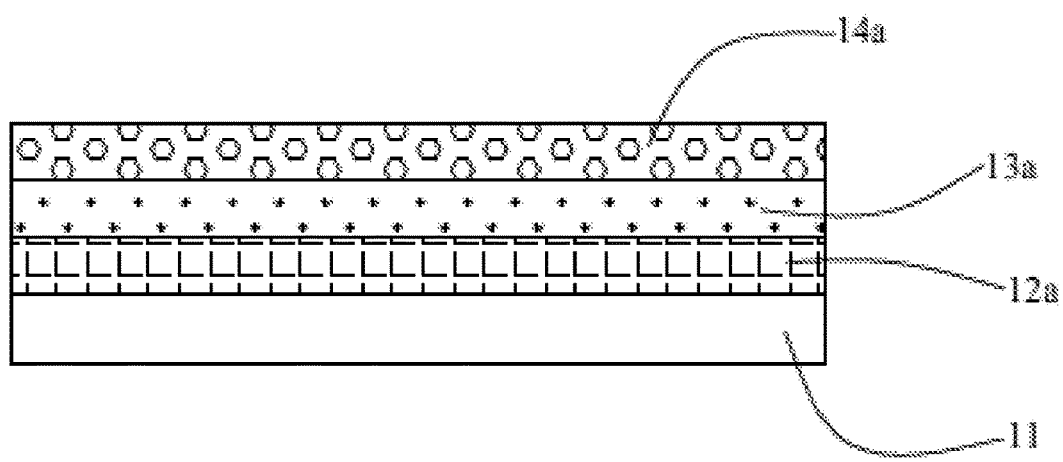

To be specific, the first wire grid material layer 12a is disposed on the substrate 11 by using physical vapor deposition, as shown in FIG. 2; then the second wire grid material layer 13a is disposed on the first wire grid material layer 12a by using physical vapor deposition or chemical vapor deposition, as shown in FIG. 3; and finally the third wire grid material layer 14a is disposed on the second wire grid material layer 13a by using physical vapor deposition, as shown in FIG. 4. In the above processes, temperatures thereof are all controlled between 100° C.-300° C.

To be more specific, the first wire grid material layer 12a has a thickness of 10 nm-300 nm; the second wire grid material layer 13a has a thickness of 10 nm-150 nm; and the third wire grid material layer 14a has a thickness of 10 nm-300 nm.

Preferably, the thicknesses of the first wire grid material layer 12a, the second wire grid material layer 13a and the third wire grid material layer 14a are controlled to be equal to each other, so that the finally obtained nanowire grid polarizer has a better contrast.

Materials for the first wire grid material layer 12a and the third wire grid material layer 14a are metals, such as Al, Cu and the like; while a material for the second wire grid material layer 13a is selected from any one of $SiO_2$, SiN and ITO. Preferably, the materials for the first wire grid material layer 12a and the third wire grid material layer 14a are the same.

In the present embodiment, the substrate 11 is specifically a glass substrate, the materials for the first wire grid material layer 12a and the third wire grid material layer 14a are Al, and the material for the second wire grid material layer 13a is ITO.

Step S2: disposing a nano photoresist array 21 on the third wire grid material layer 14a by nanoimprinting.

Figure 5:
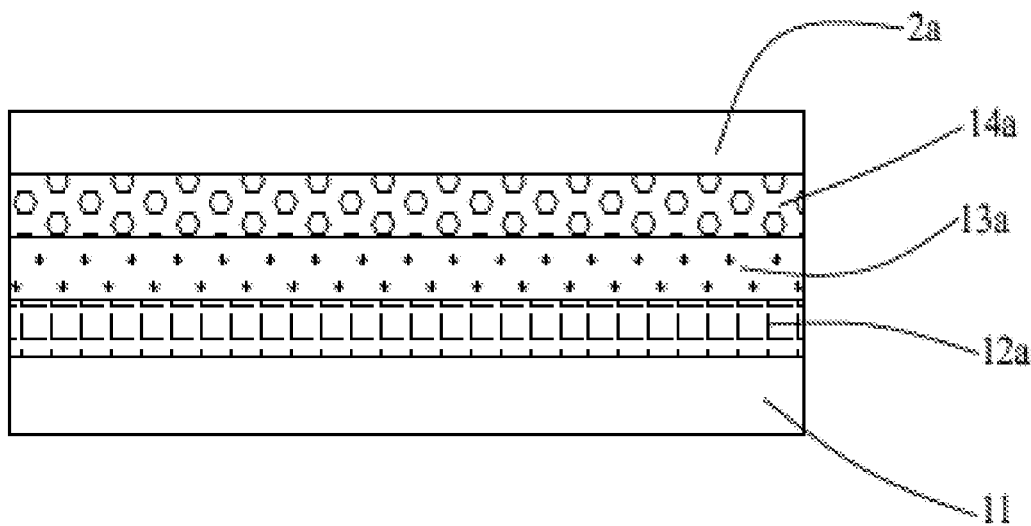
Figure 6:
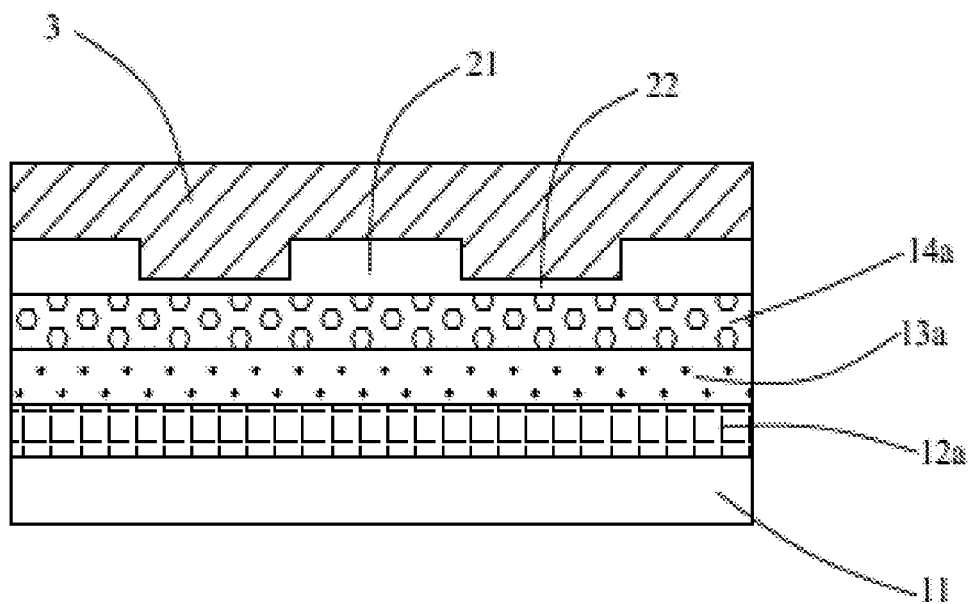
Figure 7:
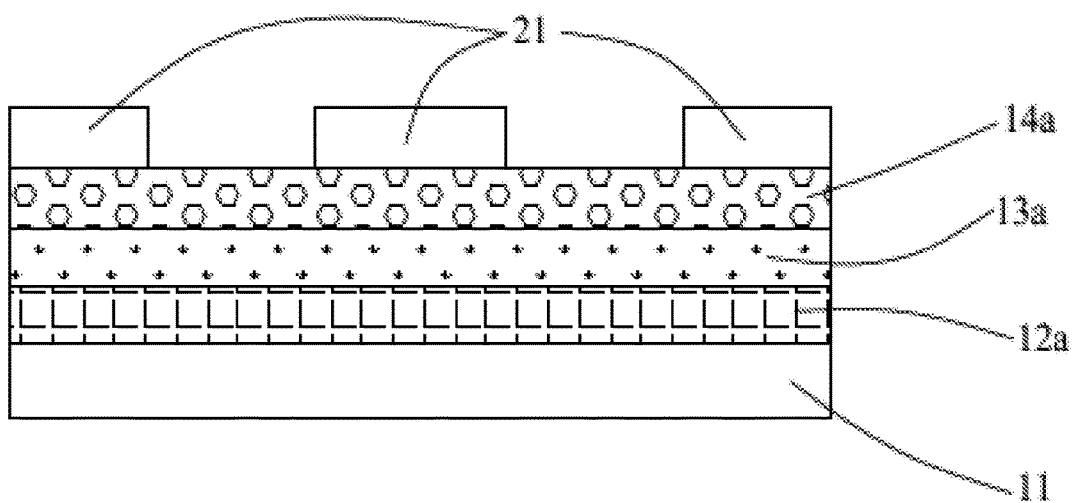

To be specific, the process of disposing the nano photoresist array 21 specifically includes: (1) disposing a photoresist layer 2a on the third wire grid material layer 14a, as shown in FIG. 5; (2) performing thermal curing on the photoresist layer by using an ultraviolet light after imprinting the photoresist layer 2a by using a nanoimprint mold 3, to form the nano photoresist array 21 and a photoresist residual layer 22 located between the nano photoresist array 21, on the third wire grid material layer 14a, as shown in FIG. 6; and (3) removing the photoresist residual layer 22, that is, the nano photoresist array 21 is obtained on the third wire grid material layer 14a, as shown in FIG. 7.

Generally, the photoresist layer 2a has a thickness of 1 μm-5 μm.

Preferably, the thermal curing is performed by using the ultraviolet light having a wavelength of 300 nm-400 nm and an energy of 300 MJ-5000 MJ at a temperature of 80° C.-300° C. for 10 s-300 s.

Figure 8:
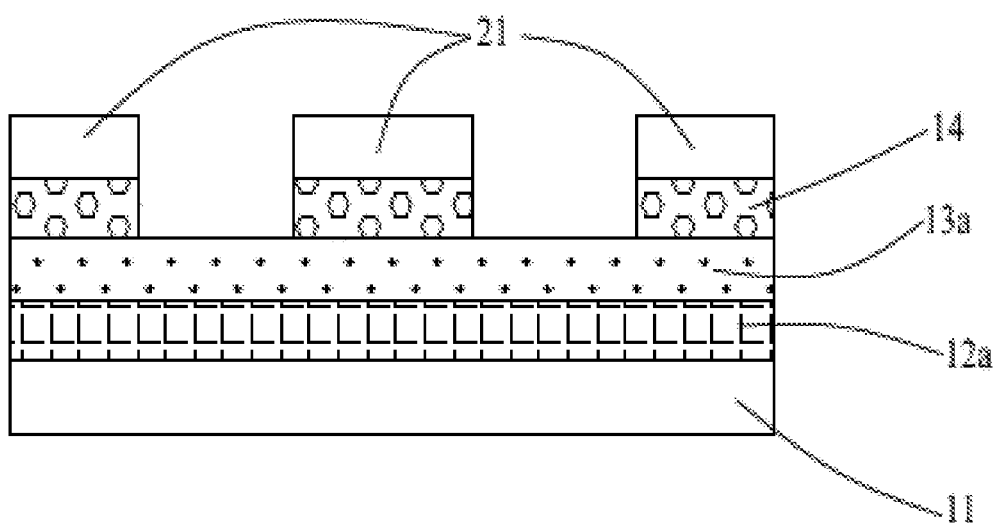

Step S3: etching the third wire grid material layer which is not covered by the nano photoresist array 21 by dry-etching to obtain a third sub wire grid 14, as shown in FIG. 8.

In the present embodiment, since the material for the third wire grid material layer 14a is Al, when performing etching by dry-etching, the plasma gas can be selected to be $O_2/Cl_2$; and of course, when the material for the third wire grid material layer 14a is changed, the plasma gas is adjusted accordingly, which is omitted here, and those skilled in the art may refer to the prior art.

Figure 9:
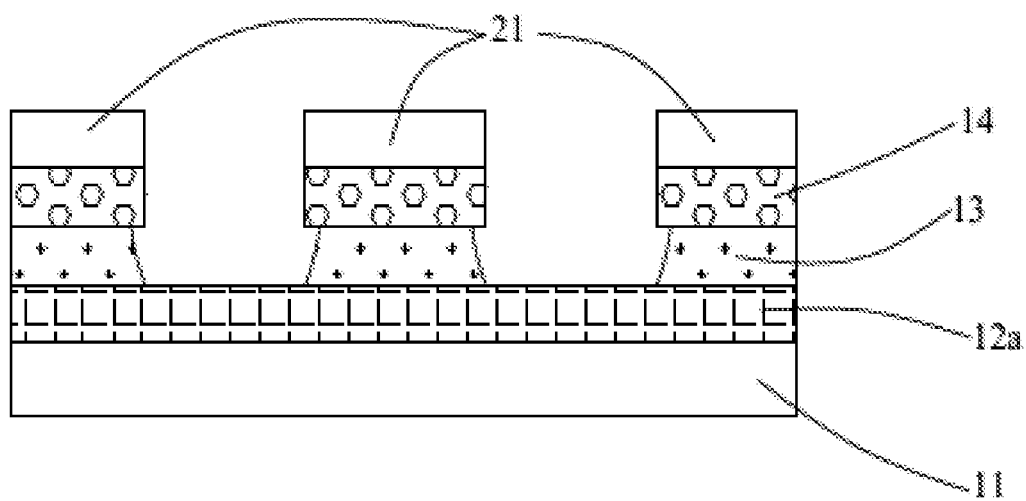

Step S4: etching the second wire grid material layer which is not covered by the nano photoresist array 21 by wet-etching to obtain a second sub wire grid 13, as shown in FIG. 9.

In the present application, when performing etching by wet-etching, it is required that the selected etchant should not react with the materials for the first wire grid material layer 12a and the third wire grid material layer 14a, or at least at a very slow reaction rate, to avoid unnecessary etching, and thus, a system with weak acid such as oxalic acid, boric acid and the like may be selected to control the reaction using the wet-etching method; and generally, a etching temperature is controlled to be 15° C.-60° C., and a reaction time is controlled to be 30 s-120 s.

Figure 10:
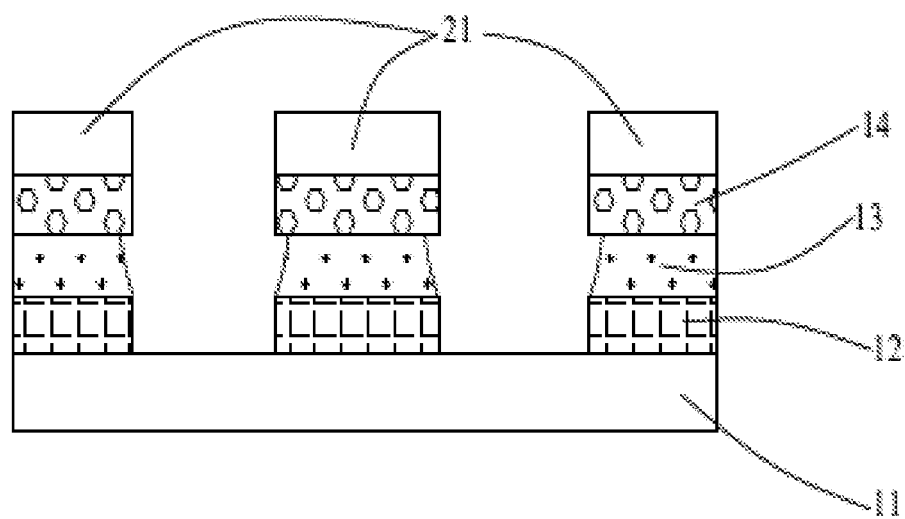

Step S5: etching the first wire grid material layer which is not covered by the nano photoresist array 21 by dry-etching to obtain a first sub wire grid 12, as shown in FIG. 10.

The first wire grid material layer 12a which is not covered by the nano photoresist array 21 is etched by using the same method as that in step S3.

Figure 11:
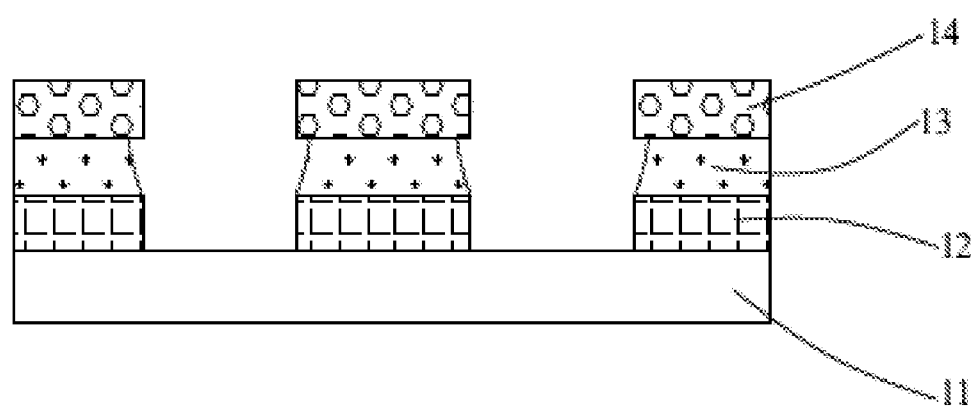

Step S6: removing the nano photoresist array 21 to obtain the nanowire grid polarizer, as shown in FIG. 11.

So, the nanowire grid polarizer, of which nanowire grids have a wirewidth of 10 nm-100 nm and an aspect ratio of 20 nm-200 nm, is obtained, and in the nanowire grid polarizer, nanowire grids are formed by the first sub wire grid 12, the second sub wire grid 13 and a third sub wire grid 14, which are sequentially laminated.

Obviously, in the nanowire grid polarizer, the wirewidth and the aspect ratio of the nanowire grids are related to the nano photoresist array 21. Accordingly, the nanowire grid polarizer may be formed by selecting the nanoimprint molds 3 with different specifications, to obtain the nanowire grid polarizer having a high depth-to-width ratio; and in addition, with reference to FIG. 9, it can be seen that, after the second wire grid material layer 13a is etched by wet-etching, based on isotropy of the wet-etching method, there will be smaller tapper angles However, since the method of manufacturing the nanowire grid polarizer in accordance with the present disclosure adopts the wire grid material layer having a "sandwich" structure and adopts multi-segment etching method to perform a segmented etching process, which reduces the etched thickness for each etching process, thereby greatly reducing the angle of the tapper angles, avoiding the defects of the wet-etching method, and meanwhile also avoiding the problems existing in the dry-etching method, such as the problems that the energy consumption is too large and the film material compositions are limited.

Although the present disclosure has been described with reference to specific exemplary embodiments, those skilled in the art will understand that various changes in form and details may be made therein without departing from the spirit and scope of the disclosure as defined by the appended claims and its equivalents.

What is claimed:

1. A method of manufacturing a nanowire grid polarizer, comprising:
    Step S1: sequentially laminating a first wire grid material layer, a second wire grid material layer and a third wire grid material layer on a substrate, wherein materials for the first wire grid material layer and the third wire grid material layer are same;
    Step S2: disposing a nano photoresist array on the third wire grid material layer by nanoimprinting;
    Step S3: etching the third wire grid material layer which is not covered by the nano photoresist array by dry-etching;
    Step S4: etching the second wire grid material layer which is not covered by the nano photoresist array by wet-etching;
    Step S5: etching the first wire grid material layer which is not covered by the nano photoresist array by dry-etching; and
    Step S6: removing the nano photoresist array to obtain the nanowire grid polarizer.

2. The method of claim 1, wherein nanowire grids of the nanowire grid polarizer have a wirewidth of 10 nm-100 nm, and an aspect ratio of 20 nm-200 nm.

3. The method of claim 1, wherein materials for the first wire grid material layer and the third wire grid material layer are metals, and a material for the second wire grid material layer is selected from any one of $SiO_2$, SiN and ITO.

4. The method of claim 3, wherein the first wire grid material layer and the third wire grid material layer are disposed by using physical vapor deposition, and the second wire grid material layer is disposed by using physical vapor deposition or chemical vapor deposition.

5. The method of claim 1, wherein the Step S2 comprises:
    disposing a photoresist layer on the third wire grid material layer;
    performing thermal curing on the photoresist layer by using an ultraviolet light after imprinting the photoresist layer by using a nanoimprint mold, to form the nano photoresist array and a photoresist residual layer located between the nano photoresist array, on the third wire grid material layer; and
    removing the photoresist residual layer.

6. The method of claim 5, wherein the photoresist layer has a thickness of 1 μm-5 μm.

7. The method of claim 5, wherein the thermal curing is performed by using the ultraviolet light having a wavelength of 300 nm-400 nm and an energy of 300 MJ-5000 MJ at a temperature of 80° C.–300° C. for 10 s-300 s.

8. The method of claim 1, wherein the first wire grid material layer has a thickness of 10 nm-300 nm, the second wire grid material layer has a thickness of 10 nm-150 nm, and the third wire grid material layer has a thickness of 10 nm-300 nm.

9. The method of claim 8, wherein materials for the first wire grid material layer and the third wire grid material layer are metals, and a material for the second wire grid material layer is selected from any one of $SiO_2$, SiN and ITO.

10. The method of claim 9, wherein the first wire grid material layer and the third wire grid material layer are disposed by using physical vapor deposition, and the second wire grid material layer is disposed by using physical vapor deposition or chemical vapor deposition.

11. The method of claim 8, wherein the thicknesses of the first wire grid material layer, the second wire grid material layer and the third wire grid material layer are equal to each other.

12. The method of claim 11, wherein materials for the first wire grid material layer and the third wire grid material layer are metals; and a material for the second wire grid material layer is selected from any one of $SiO_2$, SiN and ITO.

13. The method of claim 12, wherein the first wire grid material layer and the third wire grid material layer are disposed by using physical vapor deposition, and the second wire grid material layer is disposed by using physical vapor deposition or chemical vapor deposition.

* * * * *